United States Patent
Lee et al.

(10) Patent No.: US 8,790,160 B2
(45) Date of Patent: Jul. 29, 2014

(54) CHEMICAL MECHANICAL POLISHING COMPOSITION AND METHOD FOR POLISHING PHASE CHANGE ALLOYS

(75) Inventors: Jaeseok Lee, Wilmington, DE (US); Yi Guo, Newark, DE (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 761 days.

(21) Appl. No.: 13/096,707

(22) Filed: Apr. 28, 2011

(65) Prior Publication Data

US 2012/0276819 A1    Nov. 1, 2012

(51) Int. Cl.
*B24B 1/00* (2006.01)

(52) U.S. Cl.
USPC ............... 451/36; 451/41; 51/308; 438/693; 257/E21.23

(58) Field of Classification Search
USPC ............... 451/36, 41, 63, 285, 287; 51/308; 257/E21.23; 438/691, 692, 693
See application file for complete search history.

(56) References Cited

U.S. PATENT DOCUMENTS

| | | | | |
|---|---|---|---|---|
| 6,176,895 B1 * | 1/2001 | DeSimone et al. | ............. | 75/723 |
| 7,064,070 B2 * | 6/2006 | Mullee et al. | ................. | 438/691 |
| 7,211,122 B2 * | 5/2007 | Iwasa | ............................. | 51/308 |
| 7,442,646 B2 * | 10/2008 | Kim et al. | ..................... | 438/691 |
| 7,485,162 B2 * | 2/2009 | Matsuda et al. | ................ | 51/308 |
| 7,682,976 B2 * | 3/2010 | Kim | ............................. | 438/692 |
| 7,687,393 B2 * | 3/2010 | Iwasa | ............................. | 438/631 |
| 7,897,061 B2 * | 3/2011 | Dysard et al. | ................ | 252/79.1 |
| 7,915,071 B2 * | 3/2011 | Siddiqui et al. | ................ | 438/95 |
| 2004/0033757 A1 * | 2/2004 | Chandrasekaran et al. | ...... | 451/5 |
| 2004/0098924 A1 * | 5/2004 | Iwasa | ............................. | 51/302 |
| 2004/0108302 A1 * | 6/2004 | Liu et al. | ......................... | 216/83 |
| 2004/0142564 A1 * | 7/2004 | Mullee et al. | ................. | 438/689 |
| 2005/0108949 A1 * | 5/2005 | Matsuda et al. | ................ | 51/308 |
| 2005/0255693 A1 * | 11/2005 | Liu et al. | ....................... | 438/633 |
| 2005/0263490 A1 * | 12/2005 | Liu et al. | ......................... | 216/84 |
| 2006/0030155 A1 * | 2/2006 | Kim et al. | ...................... | 438/691 |
| 2007/0178700 A1 * | 8/2007 | Dysard et al. | ................. | 438/689 |
| 2007/0181852 A1 * | 8/2007 | Liu et al. | ...................... | 252/79.1 |
| 2007/0186485 A1 * | 8/2007 | Iwasa | ............................. | 51/308 |
| 2007/0186486 A1 * | 8/2007 | Iwasa | ............................. | 51/308 |
| 2008/0134837 A1 * | 6/2008 | Wai et al. | ......................... | 75/396 |
| 2009/0068839 A1 * | 3/2009 | Kim et al. | ..................... | 438/692 |
| 2009/0137122 A1 * | 5/2009 | Liu et al. | ....................... | 438/693 |
| 2009/0215269 A1 * | 8/2009 | Boggs et al. | ................... | 438/693 |
| 2010/0112906 A1 * | 5/2010 | Liu | ................................. | 451/41 |
| 2010/0130013 A1 * | 5/2010 | Liu et al. | ....................... | 438/693 |
| 2010/0190339 A1 * | 7/2010 | Chen et al. | .................... | 438/693 |
| 2011/0294293 A1 * | 12/2011 | Wang et al. | ................... | 438/692 |
| 2012/0001118 A1 * | 1/2012 | Koo et al. | ...................... | 252/79.1 |
| 2012/0003834 A1 * | 1/2012 | Koo et al. | ...................... | 438/693 |
| 2012/0276742 A1 * | 11/2012 | Lee et al. | ....................... | 438/693 |
| 2012/0276819 A1 * | 11/2012 | Lee et al. | ......................... | 451/41 |

OTHER PUBLICATIONS

Copending U.S. Appl. No. 12/828,441.
Copending U.S. Appl. No. 13/096,740.

\* cited by examiner

*Primary Examiner* — Eileen P. Morgan
(74) *Attorney, Agent, or Firm* — Thomas S. Deibert

(57) ABSTRACT

A method for chemical mechanical polishing of a substrate comprising a germanium-antimony-tellurium chalcogenide phase change alloy (GST) using a chemical mechanical polishing composition comprising, as initial components: water; an abrasive; at least one of a phthalic acid, a phthalic anhydride, a phthalate compound and a phthalic acid derivative; a chelating agent; a poly(acrylic acid-co-maleic acid); and an oxidizing agent; wherein the chemical mechanical polishing composition facilitates a high GST removal rate with low defectivity.

8 Claims, No Drawings

CHEMICAL MECHANICAL POLISHING COMPOSITION AND METHOD FOR POLISHING PHASE CHANGE ALLOYS

The present invention relates to a chemical mechanical polishing composition and methods of using the same. More particularly, the present invention relates to a chemical mechanical polishing composition for polishing a substrate having a germanium-antimony-tellurium phase change alloy.

Phase change random access memory (PRAM) devices that use phase change materials that can be electrically transitioned between an insulating, generally amorphous state and a conductive, generally crystalline state have become a leading candidate for the next generation of memory devices. These next generation PRAM devices may replace conventional solid state memory devices such as dynamic random access memory—DRAM—devices; static random access memory—SRAM—devices, erasable programmable read only memory—EPROM—devices, and electrically erasable programmable read only memory—EEPROM—devices that employ microelectronic circuit elements for each memory bit. These conventional solid state memory devices consume a lot of chip space to store information, thus limiting chip density; and are also relatively slow to program.

Phase change materials useful in PRAM devices include chalcogenide materials such as, germanium-tellurium (Ge—Te) and germanium-antimony-tellurium (Ge—Sb—Te) phase change alloys. The manufacture of PRAM devices include chemical mechanical polishing steps in which chalcogenide phase change materials are selectively removed and the device surface is planarized.

Tellurium tends to be relatively mobile in chalcogenide phase change alloy films. Under CMP conditions tellurium may tend to migrate and agglomerate on the surface of the wafer during planarization. This leads to films with non-homogenous compositions and surface characteristics that vary from one location to another across the wafer.

One polishing composition for polishing substrates having a chalcogenide phase change material is disclosed in United States Patent Application Publication No. 20070178700 to Dysard et al. Dysard et al. disclose a chemical mechanical polishing composition for polishing a phase change alloy containing substrate, the composition comprising: (a) a particulate abrasive material in an amount of not more than about 3 percent by weight; (b) at least one chelating agent capable of chelating the phase change alloy, a component thereof, or a substance formed from the phase change alloy material during chemical mechanical polishing; and (c) an aqueous carrier therefor.

There remains an ongoing need to develop new chemical mechanical polishing (CMP) compositions capable of selectively removing phase change materials with high removal rates, while also providing reduced total defects and Te residue defects.

The present invention provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate.

The present invention also provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the abrasive is a colloidal silica abrasive having an average particle size of 110 to 130 inn; wherein the oxidizing agent is hydrogen peroxide; wherein the chelating agent is selected from ethylene diamine tetra acetic acid and salts thereof; and wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad.

The present invention also provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the abrasive is a colloidal silica abrasive having an average particle size of 110 to 130 nm; wherein the oxidizing agent is hydrogen peroxide; wherein the chelating agent is selected from ethylene diamine tetra acetic acid and salts thereof; wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; and, wherein the chemical mechanical polishing composition facilitates the germanium-antimony-tellurium phase change alloy removal rate of ≥1,000 Å/min with a post polish SP1 defect count (>0.16 μm) of ≤200.

The present invention also provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the abrasive is a colloidal silica abrasive having an average particle size of 110 to 130 nm; wherein the oxidizing agent is hydrogen peroxide; wherein the chelating agent is selected from ethylene diamine tetra acetic acid and salts thereof; wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; wherein the chemical mechanical polishing composition facilitates the germanium-antimony-tellurium phase change alloy removal rate of ≥1,000 Å/min with a post polish SP1 defect count (>0.16 μm) of ≤200; and, wherein ≤175 of the post polishing SP1 defects are tellurium residue defects.

The present invention also provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the abrasive is a colloidal silica abrasive having an average particle size of 110 to 130 nm; wherein the oxidizing agent is hydrogen peroxide; wherein the chelating agent is selected from ethylene diamine tetra acetic acid and salts thereof; wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; wherein the chemical mechanical polishing composition facilitates the germanium-antimony-tellurium phase change alloy removal rate of ≥1,000 Å/min with a post polish SP1 defect count (>0.16 μm) of ≤200; wherein ≤175 of the post polishing SP1 defects are tellurium residue defects; wherein the substrate further comprises $Si_3N_4$; wherein at least some of the $Si_3N_4$ is removed from the substrate; and wherein the chemical mechanical polishing composition exhibits a germanium-antimony-tellurium phase change alloy to $Si_3N_4$ removal rate selectivity of ≥15:1.

The present invention also provides a method for chemical mechanical polishing of a substrate, comprising: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % of an abrasive; 0.001 to 5 wt % of at least one of a phthalic acid, a phthalic anhydride, a phthalate compound and a phthalic acid derivative; 0.001 to 5 wt % of a chelating agent; 0.001 to 0.1 wt % of a poly(acrylic acid-co-maleic acid); 0.001 to 3 wt % of an oxidizing agent; wherein the chemical mechanical polishing composition has a pH 7.1 to 12; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the abrasive is a colloidal silica abrasive having an average particle size of 110 to 130 nm; wherein the oxidizing agent is hydrogen peroxide; wherein the chelating agent is selected from ethylene diamine tetra acetic acid and salts thereof; wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; wherein the chemical mechanical polishing composition facilitates the germanium-antimony-tellurium phase change alloy removal rate of ≥1,000 Å/min with a post polish SP1 defect count (>0.16 μm) of ≤200; wherein ≤175 of the post polishing SP1 defects are tellurium residue defects; wherein the substrate further comprises tetraethyl orthosilicate (TEOS); wherein at least some of the TEOS is removed from the substrate; and, wherein the chemical mechanical polishing composition exhibits a germanium-antimony-tellurium phase change alloy to TEOS removal rate selectivity of ≥15:1.

DETAILED DESCRIPTION

The chemical mechanical polishing method of the present invention is useful for polishing a substrate containing a chalcogenide phase change alloy. The chemical mechanical polishing composition used in the method of the present invention provides a high chalcogenide phase change alloy removal rate with favorable selectivity over additional materials on the substrate and with low total defects and low Te residue defects.

Substrates suitable for use in the method of the present invention for chemical mechanical polishing comprise a germanium-antimony-tellurium (GST) phase change alloy.

Substrates suitable for use in the method of the present invention for chemical mechanical polishing optionally further comprise an additional material selected from phosphor silicate glass (PSG), boro-phosphor silicate glass (BPSG), undoped silicate glass (USG), spin-on-glass (SOG), tetraethyl orthosilicate (TEOS), plasma-enhanced TEOS (PE-TEOS), flowable oxide (FOx), high-density plasma chemical vapor deposition (HDP-CVD) oxide, and silicon nitride (e.g., $Si_3N_4$). Preferably, the substrate further comprises an additional material selected from $Si_3N_4$ and TEOS.

Abrasives suitable for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive used is a colloidal silica abrasive. More preferably, the abrasive used is a colloidal silica having an average particle size of 1 to 200 nm (more preferably 100 to 150 nm, most preferably 110 to 130 nm) as determined by well known laser light scattering techniques.

The chemical mechanical polishing composition used in the chemical mechanical polishing method of the present invention preferably comprises, as an initial component, 0.1 to 5 wt %, more preferably 0.5 to 3 wt %, still more preferably 1 to 3 wt %, yet still more preferably 1.5 to 2.5 wt % abrasive. Preferably, the abrasive is a colloidal silica abrasive. Most preferably, the chemical mechanical polishing composition of the present invention comprises, as an initial component, 1.5 to 2.5 wt % of a colloidal silica abrasive having an average particle size of 110 to 130 nm.

Preferably, the chemical mechanical polishing composition used in the chemical mechanical polishing method of the present invention comprises, as an initial component, 0.001 to 5 wt % (more preferably 0.05 to 5 wt %, still more preferably 0.1 to 4 wt %, most preferably 0.2 to 0.4 wt %) of at least one of a phthalic acid, a phthalic anhydride, a phthalate compound and a phthalic acid derivative. Preferably, phthalic acid is incorporated into the chemical mechanical polishing composition used through the addition of a phthalate compound such as for example, hydrogen potassium phthalate; or through the addition of a phthalic acid derivative such as, for example, ammonium hydrogen phthalate. Most preferably, the chemical mechanical polishing composition used in the chemical mechanical polishing method of the present invention comprises, as an initial component, 0.2 to 0.4 wt % of ammonium hydrogen phthalate.

Preferably, the chemical mechanical polishing composition used in the chemical mechanical polishing method of the present invention comprises, as an initial component, 0.001 to 5 wt % (more preferably 0.01 to 5 wt %, still more preferably 0.15 to 0.25 wt %) of a chelating agent. Preferably, wherein the chelating agent is selected from ethylene diamine tetra acetic acid (EDTA), analogs and salts thereof. Preferred analogs of EDTA include nitrilotriacetic acid (NTA); ethylene glycol tetra acetic acid (EGTA); 1,2-cyclohexanediaminetetraacetic acid (CyDTA); hexamethylene diamine tetra acetic acid (HDTA); 1,2-diaminopropane-N,N,N',N'-tetraacetic acid (Methyl-EDTA); 1,3-diamino-2-propanol-N,N,N',N'-tetraacetic acid (DPTA-OH); diethylenetriaminepentaacetic acid (DTPA); N-(2-hydroxyethyl)ethylenediamine-N,N,N', N'-triacetic acid (HEDTA); triethylenetetramine-N,N,N',N", N''',N'''-hexaacetic acid (TTHA); and salts thereof. More preferably, wherein the chelating agent is selected from ethylene diamine tetra acetic acid and salts thereof. Most preferably, wherein the chemical mechanical polishing composition used comprises, as an initial component, 0.15 to 0.25 wt % of a chelating agent, wherein the chelating agent is selected from ethylene diamine tetra acetic acid and salts thereof (e.g., ethylene diamine tetra acetic acid dipotassium salt dihydrate).

Preferably, the chemical mechanical polishing composition used in the chemical mechanical polishing method of the present invention comprises, as an initial component, 0.001 to 0.1 wt % (more preferably 0.01 to 0.1 wt %, more preferably 0.04 to 0.06 wt %) of a poly(acrylic acid-co-maleic acid). Still more preferably, the chemical mechanical polishing composition used in the chemical mechanical polishing method of the present invention comprises, as an initial component, 0.001 to 0.1 wt % (yet more preferably 0.01 to 0.1 wt %, most preferably 0.04 to 0.06 wt %) of a poly(acrylic acid-co-maleic acid), wherein the poly(acrylic acid-co-maleic acid) has a weight average molecular weight of 2,500 to 10,000 (preferably 2,500 to 5,000; most preferably 2,500 to 3,500).

Preferably, the chemical mechanical polishing composition used in the chemical mechanical polishing method of the present invention comprises, as an initial component, 0.001 to 3 wt % (more preferably 0.01 to 3 wt %, still more preferably 0.05 to 0.15 wt %) of an oxidizing agent. Preferably, the oxidizing agent is hydrogen peroxide. Most preferably, the chemical mechanical polishing composition used in the chemical mechanical polishing method of the present invention comprises, as an initial component, 0.05 to 0.15 wt % of hydrogen peroxide.

Preferably, the water used in the chemical mechanical polishing composition used in the chemical mechanical polishing method of the present invention is at least one of deionized and distilled to limit incidental impurities.

The chemical mechanical polishing composition used in the chemical mechanical polishing method of the present invention optionally further comprises additional additives selected from pH adjusters, dispersants, surfactants, buffers and biocides.

The chemical mechanical polishing composition used in the chemical mechanical polishing method of the present invention preferably has a pH of 7.1 to 12 (preferably 7.5 to 10, more preferably 7.5 to 9, most preferably 7.5 to 8.5). Acids suitable for adjusting the pH of the chemical mechanical polishing composition include, for example, nitric acid, sulfuric acid and hydrochloric acid. Bases suitable for adjusting the pH of the chemical mechanical polishing composition include, for example, ammonium hydroxide, potassium hydroxide, tetramethylammonium hydroxide and bicarbonate; preferably tetramethylammonium hydroxide.

Optionally, in the chemical mechanical polishing method of the present invention, the substrate further comprises $Si_3N_4$; wherein at least some of the $Si_3N_4$ is removed from the substrate; and, wherein the chemical mechanical polishing composition used exhibits a germanium-antimony-tellurium phase change alloy to $Si_3N_4$ removal rate selectivity of ≥10:1 (more preferably ≥15:1; most preferably ≥18:1).

Optionally, in the chemical mechanical polishing method of the present invention, the substrate further comprises tetraethyl orthosilicate (TEOS); wherein at least some of the TEOS is removed from the substrate and wherein the chemical mechanical polishing composition exhibits a germanium-antimony-tellurium phase change alloy to TEOS removal rate selectivity of ≥10:1 (preferably ≥15:1; more preferably ≥16:1).

Preferably, the chemical mechanical polishing method of the present invention, comprises: providing a substrate, wherein the substrate comprises a germanium-antimony-tellurium phase change alloy; providing a chemical mechanical polishing composition, wherein the chemical mechanical polishing composition comprises (consists essentially of), as initial components: water; 0.1 to 5 wt % (preferably 0.5 to 3 wt %, more preferably 1 to 3 wt %, most preferably 1.5 to 2.5 wt %) of an abrasive (preferably, wherein the abrasive is a colloidal silica abrasive, more preferably, a colloidal silica abrasive having an average particle size of 1 to 200 nm, yet more preferably 100 to 150 nm, most preferably 110 to 130 nm); 0.001 to 5 wt % (preferably 0.05 to 5 wt %, more preferably 0.1 to 4 wt %, most preferably 0.2 to 0.4 wt %) of at least one of a phthalic acid, a phthalic anhydride, a phthalate compound and a phthalic acid derivative (preferably ammonium hydrogen phthalate); 0.001 to 5 wt % (preferably 0.01 to 5 wt %, more preferably 0.15 to 0.25 wt %) of a chelating agent (preferably, wherein the chelating agent is selected from ethylene diamine tetra acetic acid and salts thereof); 0.001 to 0.1 wt % (preferably 0.01 to 0.1 wt %, more preferably 0.04 to 0.06 wt %) of a poly(acrylic acid-co-maleic acid); 0.001 to 3 wt % (preferably 0.01 to 3 wt %, more preferably 0.05 to 0.15 wt %) of an oxidizing agent (preferably, wherein the oxidizing agent is hydrogen peroxide); wherein the chemical mechanical polishing composition has a pH 7.1 to 12 (preferably 7.5 to 10, more preferably 7.5 to 9, most preferably 7.5 to 8.5); providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the germanium-antimony-tellurium phase change alloy is removed from the substrate; wherein the chemical mechanical polishing composition exhibits a germanium-antimony-tellurium phase change alloy removal rate of ≥1,000 Å/min with a platen speed of 60 revolutions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; wherein the chemical mechanical polishing composition facilitates the germanium-antimony-tellurium phase change alloy removal rate of ≥1,000 Å/min with a post polish SP1 defect count (>0.16 μm) of ≤200 (more preferably 0 to 200; most preferably 0 to 190); wherein ≤175 (more preferably 0 to 170; most preferably 0 to 165) of the post polishing SP1 defects are tellurium residue defects; optionally, wherein the substrate further comprises $Si_3N_4$, wherein at least some of the $Si_3N_4$ is removed from the substrate and wherein the chemical mechanical polishing composition exhibits a germanium-antimony-tellurium phase change alloy to $Si_3N_4$ removal rate selectivity of ≥15:1 (preferably ≥18:1); and, optionally, wherein the substrate further comprises tetraethyl orthosilicate (TEOS), wherein at least some of the TEOS is removed from the substrate and wherein the chemical mechanical polishing composition exhibits a germanium-antimony-tellurium phase change alloy to TEOS removal rate selectivity of ≥15:1 (preferably ≥16:1).

Some embodiments of the present invention will now be described in detail in the following Examples.

EXAMPLES

Chemical Mechanical Polishing Compositions

The chemical mechanical polishing compositions (CMPC's) tested are described in Table 1. The chemical mechanical polishing compositions A-D are comparative formulations, which are not within the scope of the claimed invention.

TABLE 1

| CMPC | AHP* (wt %) | EDTA£ (wt %) | Poly(acrylic-co-maleic acid)$ (wt %) | abrasive†† (wt %) | $H_2O_2$ (wt %) | $HClO_4$ (wt %) | pH$^\alpha$ |
|---|---|---|---|---|---|---|---|
| 1 | 0.3 | 0.2 | 0.05 | 2 | 0.1 | — | 8 |
| A | — | — | — | 3.5 | — | — | 8 |
| B | 0.3 | 0.2 | — | 2 | 0.1 | — | 8 |

TABLE 1-continued

| CMPC | AHP* (wt %) | EDTA£ (wt %) | Poly(acrylic-co-maleic acid)ᶻ (wt %) | abrasive†† (wt %) | $H_2O_2$ (wt %) | $HClO_4$ (wt %) | pHα |
|---|---|---|---|---|---|---|---|
| C | — | 0.2 | 0.05 | 2 | 0.1 | — | 8 |
| D | 0.3 | — | — | 2.5 | — | 0.2 | 8 |

*Ammonium hydrogen phosphate
£ethylene diamine tetra acetic acid dipotassium salt dihydrate
ᶻA 50 wt % solution in water of a poly(acrylic acid-co-maleic acid) having a weight average molecular weight of 3,000 from Aldrich Chemicals
††Klebosol ® K1630 colloidal silica having an average particle size of 120 nm manufactured by AZ Electronic Materials and commercially available from Rohm and Haas Electronic Materials CMP Inc.
αAdjusted through the addition of tetramethylammonium hydroxide Polishing Tests Polishing experiments were performed on germanium-antimony-tellurium (GST) blanket wafers (Si/1 kÅ thermal oxide/200 Å TiN/1500 Å GST film) from SKW Associates Inc. using the chemical mechanical polishing compositions described in Table 1. The polishing experiments were performed using an Applied Materials, Inc. Mirra® 200 mm polishing machine equipped with an ISRM detector system using an IC1010™ polyurethane polishing pad (commercially available from Rohm and Haas Electronic Materials CMP Inc.) under a 1.2 psi (8.27 kPa) down force, a chemical mechanical polishing composition flow rate of 200 ml/min, a platen speed of 60 rpm and a carrier speed of 55 rpm. A Diagrid® AD3BG-150855 diamond pad conditioner (commercially available from Kinik Company) was used to condition the polishing pad. The polishing pad was broken in with the conditioner using a down force of 14.0 lbs (6.35 kg) for 20 minutes then with a down force of 9.0 lbs (4.08 kg) for 10 minutes before polishing. The polishing pad was further conditioned in situ during wafer polishing using a down force of 9.0 lbs (4.08 kg). The GST removal rate data reported in Table 2 was determined using a Jordan Valley JVX-5200T metrology tool. $Si_3N_4$ and TEOS blanket wafers from SVTC and Advantiv respectively were also polished under the noted conditions. The $Si_3N_4$ and TEOS removal rates reported in Table 2 were determined by measuring the film thickness before and after polishing using a KLA-Tencor FX200 metrology tool. The defect count analysis for defects >0.16 μm was performed using SP1 metrology tool from KLA-Tencor. A given number (noted in TABLE 2) of randomly selected defects were reviewed using SEM EDR5200 metrology tool from KLA-Tencor to identify Te residue defects. The findings were then extrapolated for the remainder of the defects to estimate the total number of Te residue defects. The results of the polishing tests are presented in Table 2.

TABLE 2

| CMPC | GST removal rate (Å/min) | TEOS removal rate (Å/min) | $Si_3N_4$ removal rate (Å/min) | Total Defect† | SEM reviewed Defects | Te Residue Defects |
|---|---|---|---|---|---|---|
| 1 | 1045 | 65 | 57 | 188 | 50 | 165 |
| A | 204 | 85 | 58 | 806 | 100 | 467 |
| B | 938 | 74 | 55 | 312 | 50 | 218 |
| C | 149 | 40 | 36 | 1412 | 50 | 0 |
| D | 856 | 79 | 88 | 939 | 100 | 667 |

†Total defects having a size >0.16 μm.

We claim:
1. A method for chemical mechanical polishing of a substrate, comprising:

providing a substrate, wherein the substrate comprises a germanium-antimony-tellurium phase change alloy;
providing a chemical mechanical polishing composition, wherein the chemical mechanical polishing composition comprises, as initial components:
water;
0.1 to 5 wt % of an abrasive, wherein the abrasive is a colloidal silica abrasive having an average article size of 110 to 130 nm;
0.001 to 5 wt % of at least one of a phthalic acid, a phthalic anhydride, a phthalate compound and a phthalic acid derivative;
0.001 to 5 wt % of a chelating agent, wherein the chelating agent is selected from ethylene diamine tetra acetic ad salts thereof;
0.001 to 0.1 wt % of a poly(acrylic acid-co-maleic acid);
0.001 to 3 wt % of an oxidizing agent, wherein the oxidizing agent is hydrogen peroxide;
wherein the chemical mechanical polishing composition has a pH 7.1 to 12;
providing a chemical mechanical polishing pad;
creating dynamic contact at an interface between the chemical mechanical polishing pad and the substrate; and
dispensing the chemical mechanical polishing composition onto the chemical mechanical polishing pad at or near the interface between the chemical mechanical polishing pad and the substrate;
wherein at least some of the germanium-antimony-tellurium phase change alloy is removed from the substrate;
wherein the chemical mechanical polishing composition exhibits a germanium-antimony-tellurium phase change alloy removal rate of at least 1,000 Å/min with a platen speed of 60 revoluions per minute, a carrier speed of 55 revolutions per minute, a chemical mechanical polishing composition flow rate of 200 ml/min, and a nominal down force of 8.27 kPa (1.2 psi) on a 200 mm polishing machine where the chemical mechanical polishing pad comprises a polyurethane polishing layer containing polymeric hollow core microparticles and a polyurethane impregnated non-woven subpad; and, wherein the chemical mechanical polishing composition facilitates the germanium-antimony-tellurium phase change alloy removal rate of at least 1,000 Å/min with a post polish SP1 defect count (>0.16 μm of no more than 200.
2. The method of claim 1, wherein the substrate further comprises $Si_3N_4$; wherein at least some of the $Si_3N_4$ is removed from the substrate; and, wherein the chemical mechanical polishing composition exhibits a germanium-antimony-tellurium phase change alloy to $Si_3N_4$ removal rate selectivity of ≥10:1.

3. The method of claim 1, wherein the substrate further comprises tetraethyl orthosilicate (TEOS); wherein at least some of the TEOS is removed from the substrate and wherein the chemical mechanical polishing composition exhibits a germanium-antimony-tellurium phase change alloy to TEOS removal rate selectivity of $\geq 10:1$.

4. The method of claim 1, wherein the substrate further comprises $Si_3N_4$; wherein at least some of the $Si_3N_4$ is removed from the substrate; and wherein the chemical mechanical polishing composition exhibits a germanium-antimony-tellurium phase change alloy to $Si_3N_4$ removal rate selectivity of $\geq 15:1$.

5. The method of claim 1, wherein the substrate further comprises tetraethyl orthosilicate (TEOS); wherein at least some of the TEOS is removed from the substrate; and, wherein the chemical mechanical polishing composition exhibits a germanium-antimony-tellurium phase change alloy to TEOS removal rate selectivity of $\geq 15:1$.

6. The method of claim 1, wherein $\leq 175$ of the post polishing SP1 defects are tellurium residue defects.

7. The method of claim 6, wherein the substrate further comprises $Si_3N_4$; wherein at least some of the $Si_3N_4$ is removed from the substrate; and wherein the chemical mechanical polishing composition exhibits a germanium-antimony-tellurium phase change alloy to $Si_3N_4$ removal rate selectivity of $\geq 15:1$.

8. The method of claim 6, wherein the substrate further comprises tetraethyl orthosilicate (TEOS); wherein at least some of the TEOS is removed from the substrate; and, wherein the chemical mechanical polishing composition exhibits a germanium-antimony-tellurium phase change alloy to TEOS removal rate selectivity of $\geq 15:1$.

* * * * *